(12) United States Patent
Lin (10) Patent No.: US 10,186,493 B2
(45) Date of Patent: Jan. 22, 2019

(54) SEMICONDUCTOR COPPER METALLIZATION STRUCTURE AND RELATED METHODS

(71) Applicant: SEMICONDUCTOR COMPONENTS INDUSTRIES, LLC, Phoenix, AZ (US)

(72) Inventor: Yusheng Lin, Phoenix, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/892,485

(22) Filed: Feb. 9, 2018

(65) Prior Publication Data

US 2018/0166407 A1    Jun. 14, 2018

Related U.S. Application Data

(62) Division of application No. 15/254,640, filed on Sep. 1, 2016, now Pat. No. 9,905,522.

(51) Int. Cl.
*H01L 21/44* (2006.01)
*H01L 23/00* (2006.01)
(Continued)

(52) U.S. Cl.
CPC ........ *H01L 24/05* (2013.01); *H01L 21/02035* (2013.01); *H01L 21/26513* (2013.01); *H01L 21/304* (2013.01); *H01L 21/324* (2013.01); *H01L 24/03* (2013.01); *H01L 24/45* (2013.01); *H01L 2224/0218* (2013.01); *H01L 2224/0219* (2013.01); *H01L 2224/02205* (2013.01); *H01L 2224/02215* (2013.01); *H01L 2224/0362* (2013.01); *H01L 2224/03462* (2013.01); *H01L 2224/04042* (2013.01); *H01L 2224/05124* (2013.01); *H01L 2224/05147* (2013.01); *H01L 2224/05184* (2013.01); *H01L 2224/05582* (2013.01); *H01L 2224/05647* (2013.01);
(Continued)

(58) Field of Classification Search
CPC ........ H01L 24/45; H01L 24/05; H01L 24/03; H01L 21/304; H01L 21/02035; H01L 21/26513; H01L 21/324
USPC ........................................................ 438/613
See application file for complete search history.

(56) References Cited

U.S. PATENT DOCUMENTS

7,008,867 B2    3/2006    Lei
7,271,483 B2    9/2007    Lin
(Continued)

*Primary Examiner* — Luan C Thai
(74) *Attorney, Agent, or Firm* — IPTechLaw (57) ABSTRACT

Implementations of semiconductor packages may include: a silicon die including a pad, the pad including aluminum and copper; a passivation layer over at least a portion of the silicon die and a layer of one of a polyimide (PI) a polybenzoxazole (PBO), or a polymer resin coupled to the passivation layer. The package may include a first copper layer coupled over the pad, the first copper layer being about 1 microns to about 20 microns thick; a second copper layer coupled over the first copper layer, the second copper layer may be about 5 microns to about 40 microns thick; where a width of the first copper layer above the pad may be wider than a width of the second copper layer above the pad. The first and second copper layers may be configured to bond with a heavy copper wire or solder with a copper clip.

14 Claims, 8 Drawing Sheets

(51) Int. Cl.
*H01L 21/304* (2006.01)
*H01L 21/265* (2006.01)
*H01L 21/324* (2006.01)
*H01L 21/02* (2006.01)

(52) U.S. Cl.
CPC ............... *H01L 2224/0603* (2013.01); *H01L 2224/45015* (2013.01); *H01L 2224/45147* (2013.01); *H01L 2924/01028* (2013.01); *H01L 2924/01046* (2013.01); *H01L 2924/01047* (2013.01); *H01L 2924/01079* (2013.01); *H01L 2924/07025* (2013.01); *H01L 2924/1203* (2013.01); *H01L 2924/13055* (2013.01)

(56) References Cited

U.S. PATENT DOCUMENTS

| | | |
|---|---|---|
| 8,405,199 B2 | 3/2013 | Lu |
| 8,435,881 B2 | 5/2013 | Choi |
| 8,492,891 B2 | 7/2013 | Lu |
| 8,598,030 B2 | 12/2013 | Kuo |
| 8,823,166 B2 | 9/2014 | Lin |
| 8,957,524 B2 * | 2/2015 | Breuer ............ H01L 24/11 257/666 |
| 9,293,432 B2 | 3/2016 | Lin |
| 9,425,136 B2 * | 8/2016 | Kuo ............ H01L 23/49816 |
| 2006/0087034 A1 | 4/2006 | Huang |

* cited by examiner

SEMICONDUCTOR COPPER METALLIZATION STRUCTURE AND RELATED METHODS

CROSS REFERENCE TO RELATED APPLICATIONS

This application is a divisional application of the earlier U.S. Utility Patent Application to Yusheng Lin entitled "Semiconductor Copper Metallization Structure and Related Methods," application Ser. No. 15/254,640, filed Sep. 1, 2016, now pending, the disclosure of which is hereby incorporated entirely herein by reference.

BACKGROUND

1. Technical Field

Aspects of this document relate generally to semiconductor packages.

2. Background

Conventionally, to bond semiconductor packages to a motherboard or other printed circuit board wire bonds are used. The wire bonds couple to bonding pads formed is on the die of the package. Various conventional wire bonding techniques exist, including ball bonding, wedge bonding, and compliant bonding.

SUMMARY

Implementations of semiconductor packages may include: a silicon die including a pad, the pad including one of aluminum copper (AlCu), aluminum copper silicon (AlCuSi), aluminum copper tungsten (AlCuW), aluminum silicon (AlSi) or any combination thereof; a passivation layer over at least a portion of the silicon die; and a layer of one of a polyimide (PI), a polybenzoxazole (PBO), or other polymer resin coupled to the passivation layer. The packages may also include a first copper layer coupled over the pad, the first copper layer being 1 micron to 20 microns thick and a second copper layer coupled over the first copper layer, where the second copper layer may be 5 microns to 40 microns thick. A width of the first copper layer above the pad may be wider than a width of the second copper layer above the pad; and the first and the second copper layers may be configured to bond with a heavy copper wire or solder with a copper clip.

Implementations of semiconductor package may include one, all, or any of the following:

The heavy copper wire may be more than 5 mil in diameter.

The semiconductor package may further include a metal coating covering forming one of a metal cap on top of the second copper layer, a full metal coverage of the first and the second copper layers, a full metal coverage of the first and the second copper layers including a tail onto the layer of PI or PBO, and any combination thereof applied through one of electroless plating and electrolytic plating.

The metal coating may include one of nickel and gold (Ni/Au); nickel, palladium, and gold (Ni/Pd/Au); nickel and silver (Ni/Ag); and any combination thereof.

Implementations of semiconductor packages may be manufactured using an implementation of a method for making semiconductor packages. The method may include providing a die including a pad on a first side of the die, the pad including one of aluminum and copper (AlCu); aluminum, copper, and silicon (AlCuSi); aluminum, copper, and tungsten (AlCuW), aluminum silicon (AlSi), and any combination thereof; applying a passivation layer over at least a portion of the first side of the die and applying and patterning one of a polyimide (PI) layer and a polybenzoxazole (PBO) layer over the passivation layer. The method may include applying a seed layer to the pad; patterning a first photoresist layer over the seed layer and electroplating a first copper layer over the seed layer. The first copper layer may have a thickness of between 1 micron and 20 microns. The method may also include pattering a second photoresist layer over the first copper layer; electroplating a second copper layer over the first copper layer, the second copper layer having a thickness of between 5 microns and 40 microns, and removing the first photoresist layer. The method may include removing the second photoresist layer and stripping the seed layer; where the width of the first copper layer is wider than a width of the second copper layer and where the second copper layer is configured to couple with one of a heavy copper wire and with a copper clip.

Implementations of a method for making semiconductor packages may include one, all, or any of the following:

The seed layer may include one of titanium, tungsten, and copper; titanium-tungsten and copper; and any combination thereof.

The method for making semiconductor packages may further include applying a second seed layer on the first copper layer where the second seed layer may include one of titanium, tungsten and copper; titanium, tungsten and copper; and any combination thereof.

The method for making semiconductor packages may further include applying a metal plate over at least a portion of the first and the second copper layers through one of electroless plating or electrolytic plating.

The metal plate may include one of nickel and gold (Ni/Au); nickel, palladium and gold (Ni/Pd/Au); nickel and silver; or any combination thereof.

The method for making semiconductor packages may further include back grinding a second side of the die and forming a metal layer on the second side of the die.

Implementations of semiconductor packages may be manufactured using an implementation of a method for making semiconductor packages. The method may include providing a die including a pad on a first side of the die, the pad including one of aluminum copper (AlCu), aluminum, copper, silicon (AlCuSi), aluminum, copper, tungsten (AlCuW), aluminum silicon (AlSi); and any combination thereof applying a passivation layer over at least a portion of the first side of the die and over a portion of the pad; and applying and patterning one of a polyimide (PI) layer and a polybenzoxazole (PBO) layer over the passivation layer. The method may include applying a seed layer on the pad; patterning a first photoresist layer over the seed layer; electroplating a first copper layer over the seed layer, the first copper layer having a thickness of between 1 micron and 20 microns; and patterning a second photoresist layer over the first copper layer. The method may also include electroplating a second copper layer over the first copper layer, where the second copper layer may have a thickness of between 5 microns and 40 microns. The method may include removing the first photoresist layer; removing the second photoresist layer; stripping the seed layer; back grinding a second side of the die; implanting boron and phosphorus into the second side of the die; and annealing the die. The method may also include evaporating a metal layer on the second side of the die, the metal layer including one of aluminum (Al), aluminum copper (AlCu), and any combination thereof; annealing the die after evaporating the metal layer; and forming a metallization layer through one of evaporation or sputtering; the metallization layer including one of titanium, nickel, and silver; titanium, nickel and copper; titanium, nickel and gold; and any combination thereof; where the second copper layer is configured to couple to one of a heavy copper wire and a copper clip.

Implementations of a method for making semiconductors packages may include one, all, or any of the following:

The seed layer may include titanium, tungsten, copper, or any combination thereof.

The method for making semiconductor packages may further include applying a second seed layer on the first copper layer, the second seed layer may include titanium, tungsten and copper.

The method for making semiconductor packages may further include applying a metal layer over at least a portion of the first and the second copper layer through one of electroless plating and electrolytic plating.

The metal plate may include one of nickel and gold; nickel and palladium; or any combination thereof.

The heavy copper wire may be more than 5 mil in diameter.

The method for making semiconductor packages may further include forming one of an insulated gate bipolar transistor (IGBT) and a diode in the die.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor copper metallization structure will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor copper metallization structures and implementing components and methods, consistent with the intended operation and methods.

Figure 1:
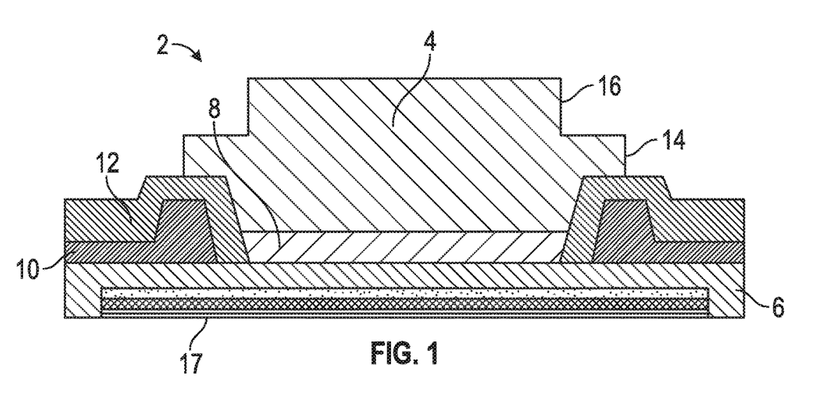
FIG. 1 is a cross sectional view of an implementation of a semiconductor package having a two-layer copper over pad metallization (OPM)
Figure 2A:
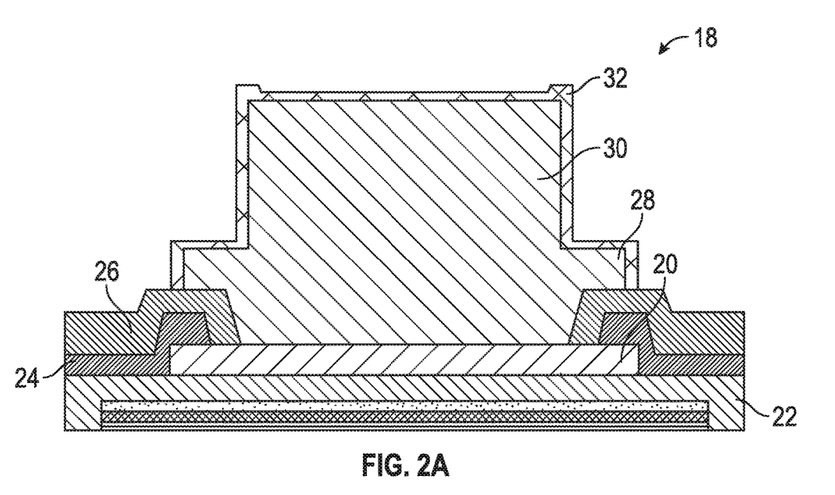
FIG. 2A is a cross sectional view of another implementation of a semiconductor package having a two-layer copper OPM with a metal coating having no tail.
Figure 5A:
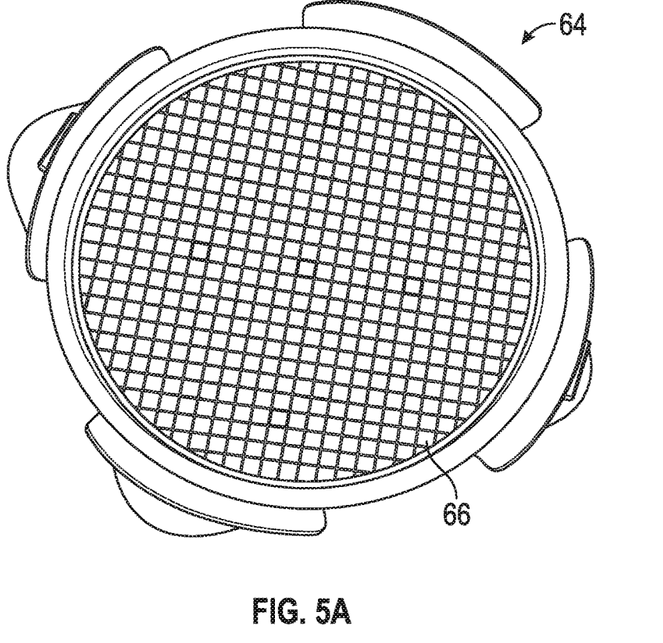
FIG. 5A is a top view of an implementation a wafer having insulated-gate bipolar transistors (IGBT) dice with a two-layer copper OPM on each die.

Referring to FIG. 1, an implementation of a semiconductor package 2 having a two-layer copper over pad metallization (OPM) 4 is illustrated. For the purpose of illustration, a single die is shown as though it was on one full wafer, but in manufacturing multiple die would be formed on a single wafer as illustrated in FIG. 5A. The reason for the magnification of the die side of the wafer relative to the back side of the wafer is for the purposes of illustration only. As illustrated, the semiconductor package includes a silicon die 6 having a pad 8 including aluminum and copper coupled to the first side of the silicon die 6. In other implementations, the pads may also include, copper, aluminum, silver, gold, titanium, any combination thereof or any other suitable material known in the art. In this particular implementation, a passivation layer 10 is over at least a portion of the silicon die 6 and does not contact the pad 8. In other implementations, the passivation layer may be in contact with the pad as illustrated in FIG. 2A. The passivation layer 10 may include, by non-limiting example, aluminum, titanium, nickel, silver, any combination thereof or any other suitable materials known in the art. As illustrated, a protective layer 12 may be coupled to the passivation layer 10 and is in contact with the pad 8. The protective layer may be either polyimide (PI), polybenzoxazole (PBO), a polymer resin, any combination thereof, or any other suitable material known in the art. The protective layer 12 protects the passivation layer 10 from stress that may be caused by the copper metallization 4 or other components of the package during formation and/or operation of the package.

The two-layer copper OPM 4 is formed of a first copper layer 14 coupled over the pad 8 and a second copper layer 16 coupled over the first copper layer. The first copper layer 14 may be between about 1 μm and about 20 μm thick. The second copper layer 16 may be between about 5 μm and about 40 μm thick. The width of the first copper layer 14, measured parallel to the pad width of FIG. 1, is wider than the similarly measured width of the second copper layer 16. The thickness of the first copper layer and the second copper layer may allow the layers to be able to support heavy copper wire bonding, clip interconnection, silver and copper, sintering, diffusion bonding and other similar bonding methods known in the art. Heavy copper wire, as used herein, is defined as having a diameter larger than about 5 mil. Another advantage of the thick two-layer copper OPM is that it may lower the hot spot temperature in power devices and it may also lower the on-resistance of the devices. On the second side of the silicon wafer 6, a back metal 17 may be added. A method for back grinding the second side of the die and adding the back metal 17 will be described in more detail below.

Figure 2B:
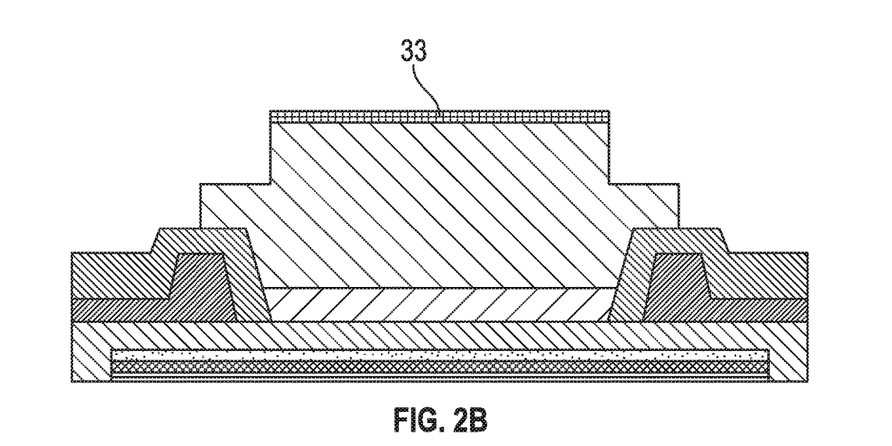
FIG. 2B is a cross sectional view of an implementation of a semiconductor package having a metal cap on a top of the second copper layer.
Figure 2C:
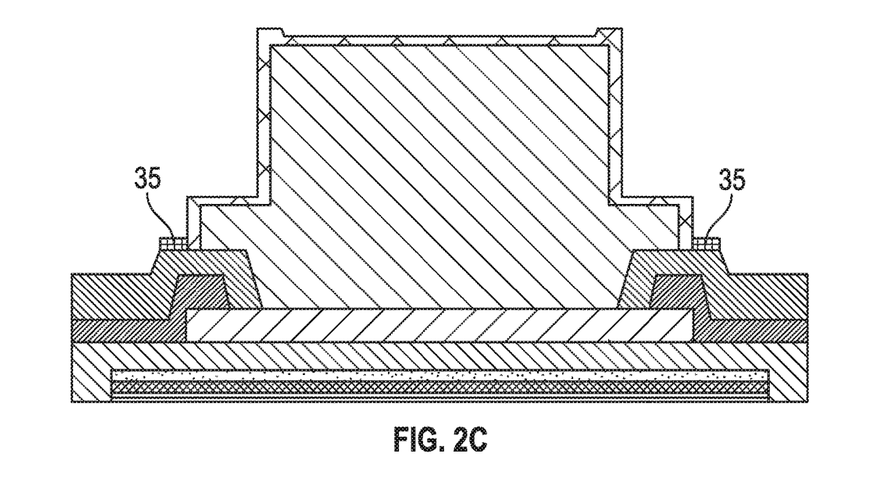
FIG. 2C is a cross section view of an implementation of a semiconductor package having a full metal coverage of the first and the second copper layers including a tail.

Referring now to FIG. 2A, another implementation of a two-layer copper OPM semiconductor package 18 is illustrated. A pad 20 is coupled to a silicon die 22. The pad 20 may include aluminum copper (AlCu), aluminum copper silicon (AlCuSi), aluminum copper tungsten (AlCuW), aluminum silicon (AlSi), any combination thereof or any other suitable materials known in the art. In this implementation, unlike the implementation of FIG. 1, the passivation layer 24 covers a portion of the die 22 and a portion of the pad 20. The passivation layer 24 may be covered with PI=, PBO, or any other suitable material known in the art 26. A first copper layer 28 is coupled over the pad 20 and a second copper layer 30 is coupled over the first copper layer 28. In this implementation, a metal coating 32 forming a full metal coverage of the first and the second copper layers including the top and the sidewalls of the copper layers. Referring to FIG. 2B, other implementations of the metal coating may form a metal cap 33 only on top of the second copper layer. In FIG. 2C, still other implementations of the metal coating may fully cover the copper layers and include a tail of metal 35 extend onto the PI layer. Other combinations of a metal coating may also be used in various implementations. The metal coating may be applied through one of electroless plating, electrolytic plating, or any other suitable method known in the art. The metal coating may include, by non-limiting example, one of nickel and gold (Ni/Au; nickel, palladium, and gold (Ni/Pd/Au); nickel and silver (Ni/Ag); any combination thereof; or any other suitable material known in the art. The metal coating could also be applied to the first and second copper layers of the implementation of FIG. 1 as well. Due to the thickness of the first copper layer 28 and second copper layer 30, they may provide similar advantages to the implementation illustrated in FIG. 1

Figure 3A:
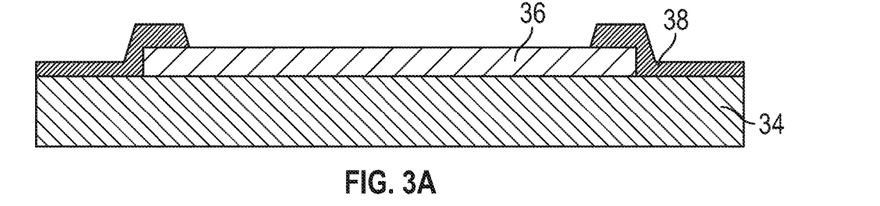
FIGS. 3A-3H show various process steps in an implementation of a method for making a semiconductor package having a two-layer copper OPM.
Figure 3B:
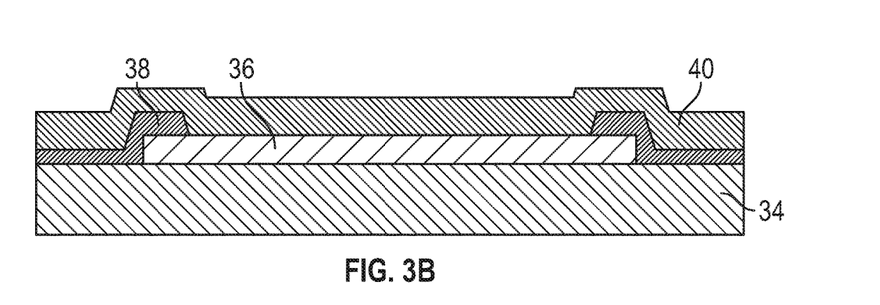
Figure 3C:
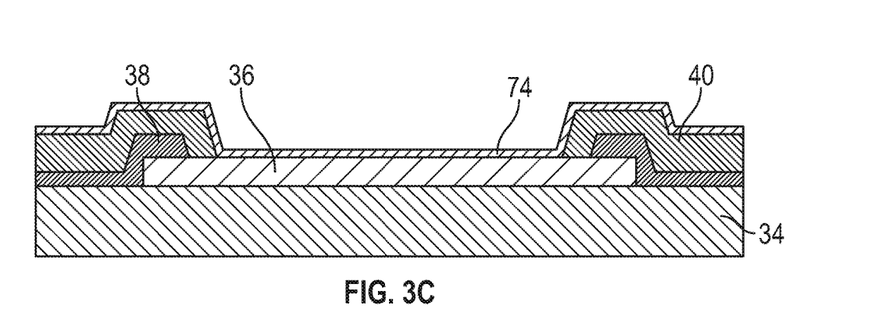
Figure 3D:
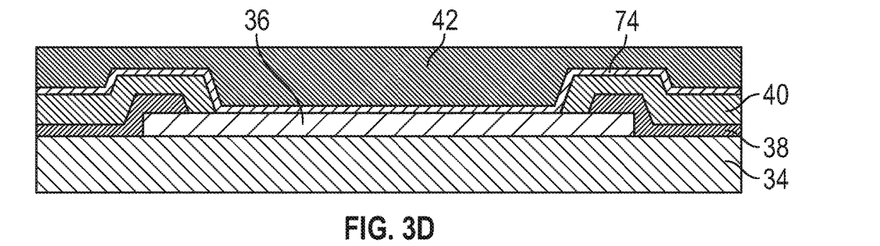

Referring to FIGS. 3A-3H, a two-layer OPM semiconductor package is illustrated at various steps in an implementation of a method of forming such a package. In FIG. 3A, a die 34 including a pad 36 is provided. The pad 36 may include aluminum, copper, tungsten, silicon, aluminum copper and silicon (AlCuSi), aluminum copper tungsten (AlCuW) or any other suitable combination as previously described herein. A passivation layer 38 is then applied/formed over at least a portion of the first side of the die 34 through a deposition process such as chemical vapor deposition (CVD) or sputtering. Referring to FIG. 3B, a layer 40 of one of PI or PBO (or another polymer resin) is then applied over the passivation layer 38. This process may involve patterning the PI or PBO or other polymer resin using various lithographic process steps, including coating, exposing, developing, and curing. Referring to FIG. 3C, the layer 40 of PI or PBO is illustrated after patterning. Referring to FIG. 3D, a seed layer 74 is then applied on/to the pad 36. The seed layer 74 may include titanium, tungsten, copper, titanium-tungsten, any combination thereof, or any other suitable material known in the art that can facilitate electrochemically forming additional metal onto the seed layer. A first photoresist layer 42 is patterned/coated over the seed layer 74 and an opening in the layer 42 is made to expose the seed layer of the pad to subsequent electrochemical processing. FIG. 3D shows the photoresist layer 42 coated over the pad and seed layer prior to patterning.

Figure 3E:
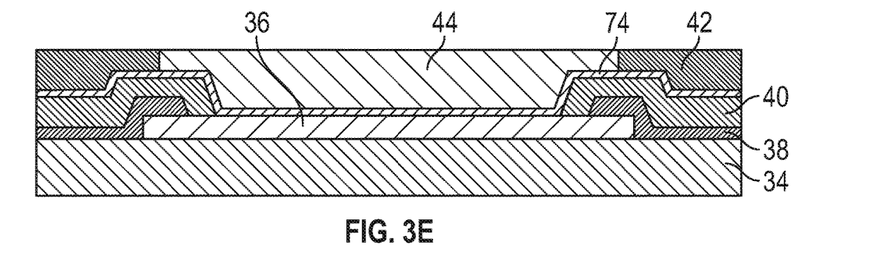
Figure 3F:
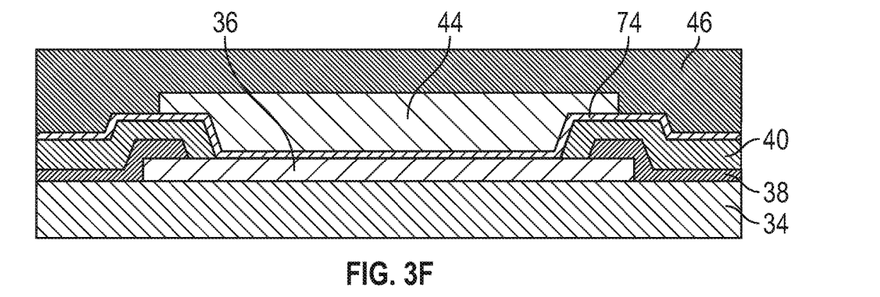
Figure 3G:
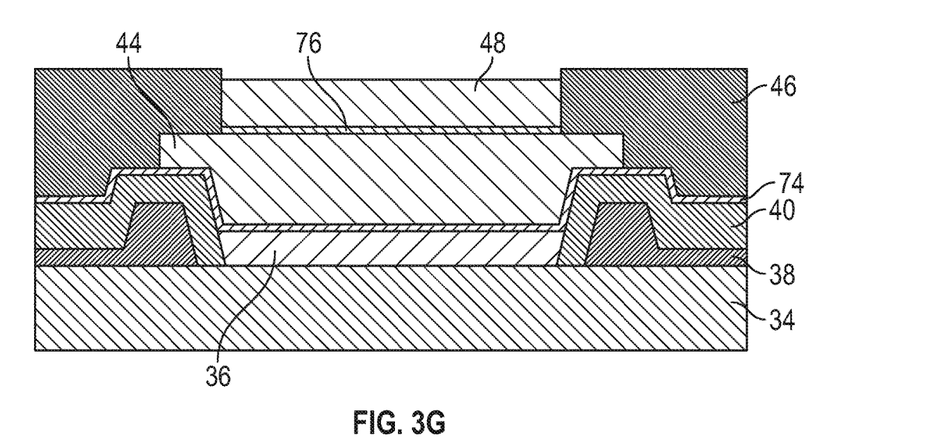

Referring to FIG. 3E, a first copper layer 44 is electroplated over the seed layer 74. The first copper layer 44 may have a thickness of between about 1 micron and about 10 microns. Referring to FIG. 3F, a second photoresist layer 46 is then patterned over the first copper layer 44, in a similar way to the patterning of the first photoresist layer 42. FIG. 3F shows the second photoresist layer 46 after coating before exposure to for an opening for subsequent electrochemical processing. Referring to FIG. 3G, a second copper layer 48 is then electroplated over the first copper layer 44. The second layer may have a thickness between about 5 microns and about 40 microns. The second copper layer 48 may be offset by the second photoresist layer 46 so that the width of the first copper layer 44 measured parallel with a width of the pad is wider than a width of the second copper layer. In various implementations, the method may include applying second seed layer 76 to the first copper layer before the second copper layer is applied. The second seed layer 76 may also include titanium, tungsten, copper, any combination thereof or any other suitable material known in the art.

Figure 3H:
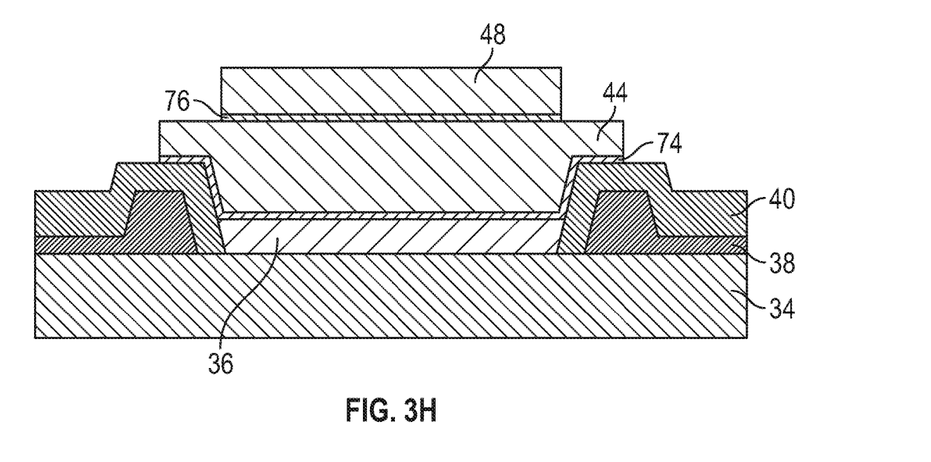

Referring now to FIG. 3H, the package is illustrated following the removal of the first photoresist layer 42, the second photoresist layer 46 is removed, and the seed layer. The second copper layer 48 is now ready for coupling with a heavy copper wire or a copper clip or for processing using silver/gold sintering diffusion bonding, etc. In other implementations, a metal plate may be applied over at least a portion of the first and the second copper layers through one of electroless plating and electrolytic plating. The metal plate may include one of nickel and gold; nickel and palladium; and any combination thereof.

Various method implementations may further include back grinding a second side of the die and forming a metal layer on the second side of the die. In various implementations, back grinding may be performed, by non-limiting example, using mechanical grinding, chemical mechanical polishing, dry etching, wet etching, bulk plasma etching, or any other suitable method in the art. The various metal layers may be formed using any material deposition and removal techniques such as electroplating, electroless plating, spinning, sputtering, evaporation, chemical vapor deposition (CVD), physical vapor deposition (PVD), etching, masking, photolithography techniques, and the like.

Figure 4A:
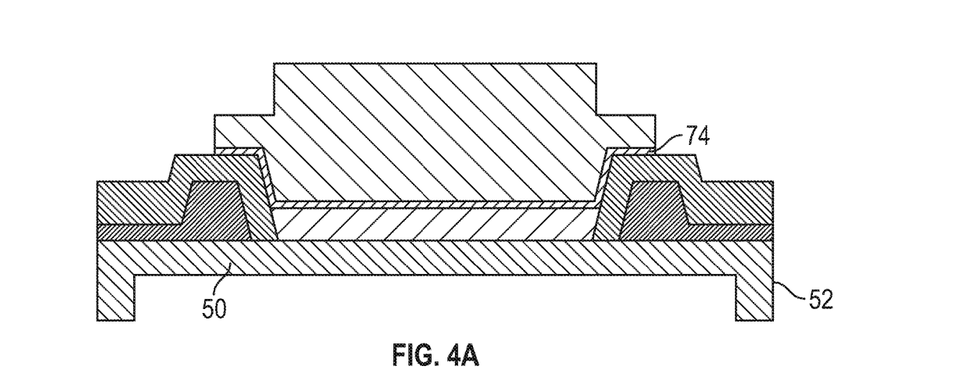
FIG. 4A-4E show various process steps in an implementation of a method of back grinding and forming a metal layer on the second side of a die having a two-layer copper OPM.
Figure 4B:
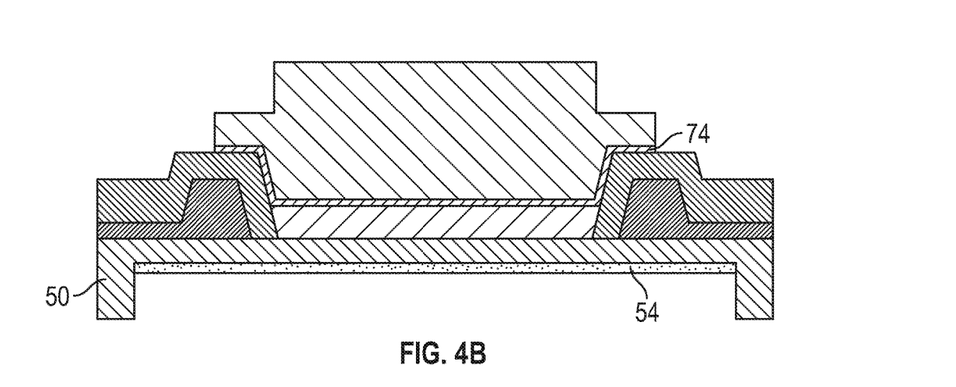

Referring now to FIGS. 4A-4E, a method for back grinding and forming a metal layer on the second side of the die (back side of the wafer) is illustrated. In FIG. 4A, after the seed layer is stripped back, grinding may be done on a second side of the die 50. Back grinding may be accomplished using the Taiko grinding process developed by Disco Hi-Tec America, Inc. of Santa Clara, Calif. The Taiko process leaves a ring of unground full-thickness material (Taiko ring) 52 around the edge of the backside of the wafer, grinding the center of the wafer 50 down to the desired thickness. The Taiko ring prevents the wafer from curling or otherwise bending during processing steps. In various implementations, the thickness of the ring may be about 3 mm and the thickness of the wafer may be between about 25 µm to about 125 µm. Referring to FIG. 4B, in various method implementations, boron and phosphorus 54 may be implanted into the second side of the die 50. In various other implementations, other materials may be implanted (doped) into the second side of the die. Which materials may be selected depends on the semiconductor substrate such as silicon, gallium arsenic, and so forth, and the type of semiconductor device(s) incorporated into the die 50.

Figure 4C:
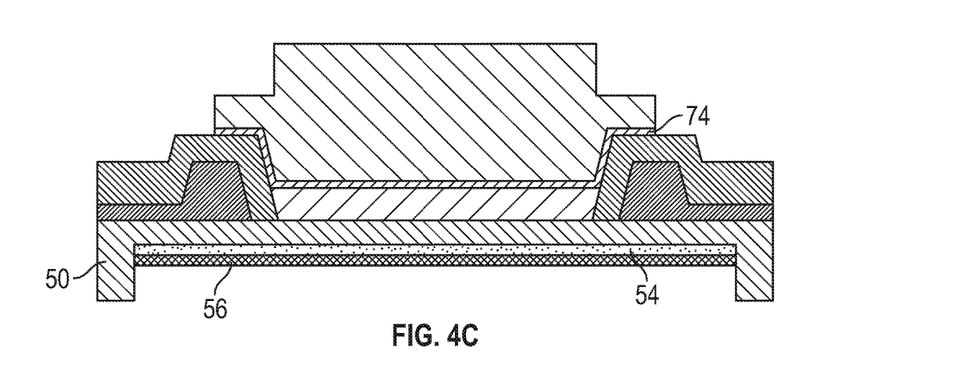
Figure 4D:
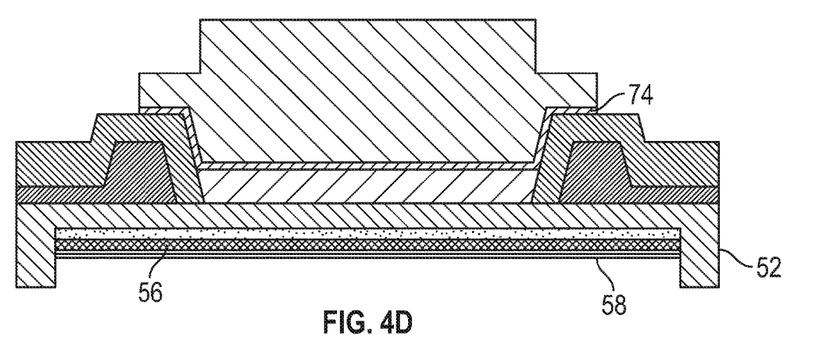

Following implanting, the die 50 may be annealed at a temperature of at least 450 C. The annealing process may help to achieve the desired distribution/movement of the implanted (dopant) materials within the material of the die substrate. Referring to FIG. 4C, an aluminum layer 56 is then evaporated on the second side of the die 50 and the die may again be annealed at a temperature of at least 360° C. Referring to FIG. 4D, the package is illustrated following the formation of a layer 58 of titanium, nickel and silver on the aluminum layer 56 though evaporation. In various implementations, an insulated gate bipolar transistor (IGBT), a diode, or any similar devices known in the art may be formed through other or similar processing steps.

Figure 4E:
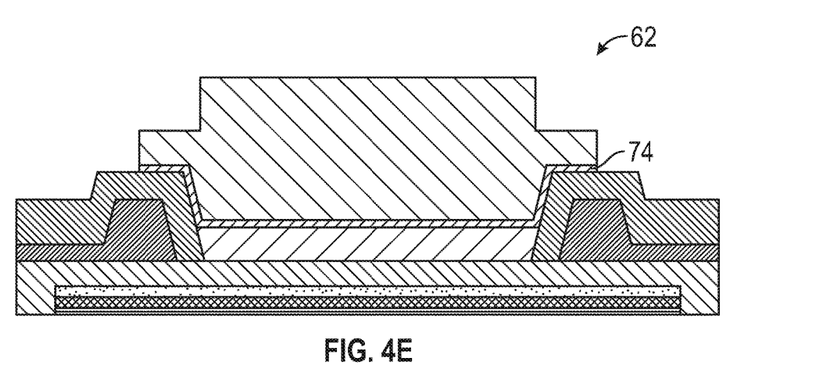

Referring now to FIG. 4E, the semiconductor package 62 is illustrated following removal of a majority of the material the Taiko ring 52. The Taiko ring 52 may be removed through sawing or grinding. The completed semiconductor package 62 therefore includes a horizontal portion and, in some implementations, may still include a portion of the Taiko ring that at least partially encloses/covers the metal layers on the second side of the die. The metal layer formed on the second side of the die (backside of the wafer) may include any number of alloys, including by non-limiting example, titanium, nickel, and silver; titanium, nickel, vanadium, gold; titanium, nickel, copper, gold; or any previously mentioned element alone, or in any possible combination with the other elements along with other electrically conductive elements.

Figure 5B:
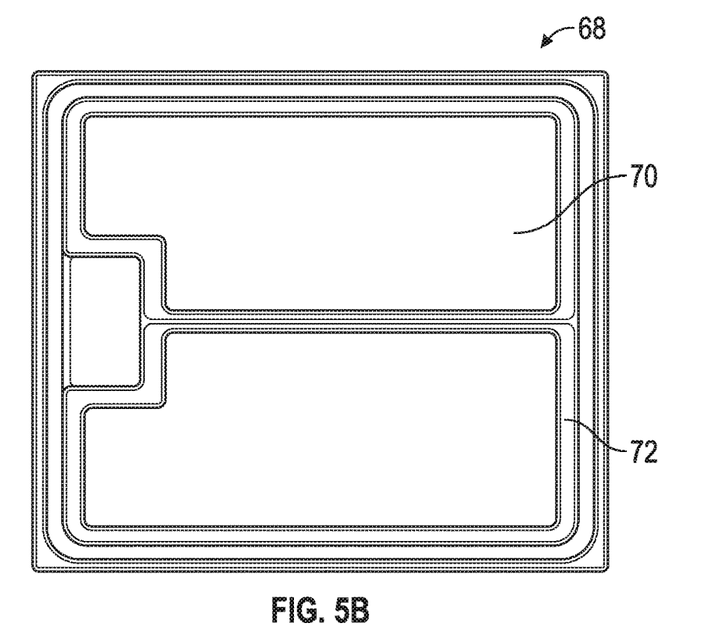
FIG. 5B is an implementation of an IGBT die with a two-layer copper OPM from FIG. 5A.

Referring now to FIG. 5A, a wafer 64 having a plurality of die 66 processed as described herein is illustrated. The individual die may be singulated from the wafer by various methods, including, by non-limiting example, punching, stamping, sawing, water jet cutting, or laser cutting. Referring to FIG. 5B, a top view of an implementation of a die having a two-layer copper OPM is illustrated. As described previously, the first layer 72 has a width that is wider than a width of the second layer 70, and so the first layer 72 is visible underneath the second layer 70.

In places where the description above refers to particular implementations of semiconductor copper metallization structures and implementing components, sub-components, methods and sub-methods, it should be readily apparent that a number of modifications may be made without departing from the spirit thereof and that these implementations, implementing components, sub-components, methods and sub-methods may be applied to other semiconductor copper metallization structures.

What is claimed is:

1. A method for making a semiconductor package, the method comprising:
    providing a die comprising a pad on a first side of the die, the pad comprising one of aluminum and copper (AlCu); aluminum, copper and silicon (AlCuSi); aluminum, copper, and tungsten (AlCuW); aluminum silicon (AlSi); or any combination thereof;
    applying a passivation layer over at least a portion of the first side of the die;
    applying and patterning one of a polyimide (PI) layer or a polybenzoxazole layer (PBO) over the passivation layer;
    applying a seed layer to the pad;
    patterning a first photoresist layer over the seed layer;
    electroplating a first copper layer directly over and to the seed layer, the first copper layer having a thickness of between 1 microns and 20 microns;
    patterning a second photoresist layer over the first copper layer;
    electroplating a second copper layer over the first copper layer, the second copper layer having a thickness of between 5 microns and 40 microns;
    removing the first photoresist layer;
    removing the second photoresist layer;
    stripping the seed layer;
    back grinding a second side of the die;
    forming a first metal layer over the second side of the die; and
    forming a second metal layer over the first metal layer;
    wherein a width of the first copper layer is wider than a width of the second copper layer; and
    wherein the second copper layer is configured to couple with one of a heavy copper wire or with a copper clip.

2. The method of claim 1, wherein the seed layer comprises one of titanium; tungsten and copper; titanium-tungsten and copper; or any combination thereof.

3. The method of claim 1, further comprising applying a second seed layer on the first copper layer, the second seed layer comprising one of titanium; tungsten, and copper; titanium-tungsten and copper; or any combination thereof.

4. The method of claim 1, further comprising applying a third metal layer over at least a portion of the first and the second copper layers through one of electroless plating or electrolytic plating.

5. The method of claim 4, wherein the third metal layer comprises one of nickel and gold (Ni/Au); nickel, palladium, and gold (Ni/Pd/Au); nickel and silver; or any combination thereof.

6. The method of claim 1, wherein the heavy copper wire is more than 5 mil in diameter.

7. A method for making a semiconductor package, the method comprising:
    providing a die comprising a pad on a first side of the die, the pad comprising one of aluminum and copper (AlCu); aluminum, copper, and silicon (AlCuSi); aluminum, copper and tungsten (AlCuW); aluminum silicon (AlSi); or any combination thereof;
    applying a passivation layer over at least a portion of the first side of the die and over a portion of the pad;
    applying and patterning one of a polyimide (PI) layer or a polybenzoxazole layer (PBO) over the passivation layer;
    applying a seed layer on the pad;
    patterning a first photoresist layer over the seed layer;
    electroplating a first copper layer over the seed layer, the first copper layer having a thickness of between 1 microns and 20 microns;
    patterning a second photoresist layer over the first copper layer;
    electroplating a second copper layer over the first copper layer, the second copper layer having a thickness of between 5 microns and 40 microns;
    removing the first photoresist layer;
    removing the second photoresist layer;
    stripping the seed layer;
    back grinding a second side of the die;
    implanting one of boron, phosphorus, or boron and phosphorous into the second side of the die;
    annealing the die;
    evaporating a metal layer on the second side of the die, the metal layer comprising one of aluminum (Al), aluminum copper (AlCu), or any combination thereof;
    annealing the die after evaporating the metal layer; and
    forming a metallization layer on the metal layer through one of evaporation or sputtering; the metallization layer comprising one of titanium, nickel, and silver; titanium, nickel, and copper; titanium, nickel, and gold; or any combination thereof;
    wherein the second copper layer is configured to couple to one of a heavy copper wire or a copper clip.

8. The method of claim 7, wherein the seed layer comprises titanium, tungsten, and copper.

9. The method of claim 7, further comprising applying a second seed layer on the first copper layer, the second seed layer comprising titanium, tungsten, and copper.

10. The method of claim 7, further comprising applying a second metal layer over at least a portion of the first and the second copper layers through one of electroless plating or electrolytic plating.

11. The method of claim 10, wherein the second metal layer comprises one of nickel and gold; nickel and palladium; or any combination thereof.

12. The method of claim 7, wherein the heavy copper wire is more than 5 mil in diameter.

13. The method of claim 7, further comprising forming one of an insulated gate bipolar transistor (IGBT) or a diode in the die.

14. The method of claim 7, wherein back grinding a second side of a die further comprises back grinding a wafer comprising the die using a Taiko back grinding process to form a Taiko ring, and the method further comprises removing the Taiko ring from the wafer by sawing.

* * * * *